United States Patent [19]
Walther et al.

[11] Patent Number: 5,155,704
[45] Date of Patent: Oct. 13, 1992

[54] MEMORY INTEGRATED CIRCUIT TEST MODE SWITCHING

[75] Inventors: Terry R. Walther; Stephen L. Casper, both of Boise, Id.

[73] Assignee: Micron Technology, Inc., Boise, Id.

[21] Appl. No.: 598,109

[22] Filed: Oct. 16, 1990

[51] Int. Cl.⁵ .............................................. G11C 29/00
[52] U.S. Cl. ................................. 365/201; 365/189.07
[58] Field of Search ........... 365/191, 201, 206, 189.07; 371/21.1, 21.4

[56] References Cited

U.S. PATENT DOCUMENTS 4,965,768 10/1990 Takeuchi ............................ 365/201

OTHER PUBLICATIONS

Toshiba Data Book, 1989, pp. A-194 through A-196.

Primary Examiner—Joseph A. Popek
Attorney, Agent, or Firm—Marger, Johnson, McCollom and Stolowitz

[57] ABSTRACT

An external test mode enable signal (xTE) applied to a memory IC is filtered on board the memory IC to prevent inadvertent switching into test mode due to noise. In one approach, the test mode enable signal passes through an internal RC low-pass filter (18,20) to reject high frequency signals. Another approach is filtering the enable signal digitally using an xRAS* signal as a filter signal. Logic (FIG. 2) is provided to assert test mode (node C) only when the external enable signal has been asserted for at least a minimum time determined by the filter signal, again to avoid false switching. Either approach allows lowering test mode enable signal voltages below those used presently. The invention, therefore, can be used with particular advantage to maintain test mode enable noise margin in small geometry circuits which cannot withstand supervoltages.

7 Claims, 2 Drawing Sheets

MEMORY INTEGRATED CIRCUIT TEST MODE SWITCHING

BACKGROUND OF THE INVENTION

Random access memory integrated circuits (RAM IC's) undergo testing by the manufacturer during production and by the end user, for example, in a memory test conducted during computer initialization. As RAM IC densities increase, so that individual RAM IC's are capable of storing four or more megabits of information, the time necessary for testing the IC's increases as well. To reduce the testing time required, it is known to place the RAM IC's in a test mode for that purpose, as distinguished from the normal operating mode. In a normal operating mode, a RAM IC reads and writes one bit or word at a time. A RAM IC could be tested in the normal operating mode but the time required to conduct exhaustive testing is excessive.

In a test mode, multiple bits or words in the RAM IC are tested simultaneously, thus reducing test time. In a four megabit DRAM, for example, Toshiba, part no. TC514100J/Z, the RAM is organized 4,194,304 words by one bit, and is internally organized as 524,288 words by eight bits. In test mode, data are written into eight sectors in parallel and retrieved in the same way. Three of the address lines are not used. If, upon reading, all bits are equal (all ones or zeros), the data output pin indicates a one. If any of the bits differed, the data output pin would indicate a zero. In test mode, therefore, the 4M DRAM can be tested as if it were a 512K DRAM, thereby reducing the testing time.

Switching a RAM IC into test mode can be accomplished by using a combination of input signals that would not be encountered in normal operation. For example, the Toshiba 4M DRAM mentioned above is switched into test mode by inserting WRITE* and CAS* signals before RAS* cycle (where an asterisk indicates a complement or active low signal). Input signal CAS* before RAS* refresh cycle or RAS* only refresh cycle returns the device to the normal operating mode.

It is also known to switch a RAM IC device into test mode by using a supervoltage technique. A test function voltage is applied to one of the IC pins (typically called TE, or test mode enable), to trigger the device into a test mode. A typical test function voltage is 4.5 volts higher than the chip supply voltage (Vcc).

As integrated circuit fabrication processes evolve to ever smaller geometries, however, it is fast becoming necessary to lower the test function voltage to a voltage that is closer to the normal signal level voltage. Very small geometry devices cannot withstand the supervoltage levels used in the past, without taking special steps to avoid leakage. However, if the test function voltage is lowered too much, there is a risk that the IC will inadvertently be triggered into test mode by signal noise normally incident in high speed circuitry and wiring. In other words, the noise margin with respect to test mode triggering is compromised.

The need remains, therefore, for a simple and reliable way to switch a RAM IC into a test mode without subjecting the device to excessive supervoltage signals, and while maintaining adequate noise immunity.

SUMMARY OF THE INVENTION

According to the present invention, the test function signal is filtered in the time domain to prevent false test mode triggering. By filtering the test function signal, the test function signal voltage can be lowered, for example, to approximately $1\frac{1}{2}$ to 2 volt above Vcc and still operate reliably. Two distinct implementations of the invention are disclosed. In one embodiment, an RC analog low-pass filter circuit is employed to filter out transient noise on the test mode enable pin. The RC circuit includes a series resistor having a value in the range of 1 to 10 K-ohms and a shunt capacitor having a value in the range of 1 to 10 picofarads. A bona fide test function signal, as it is a DC signal, is not filtered out.

According to another aspect of the invention, a digital filtering technique is used to filter out noise on the TE pin. In the digital implementation, the test enable signal must be applied for at least one row address strobe (RAS) cycle. The RAS cycle is used as a reference time in the case of dynamic RAM (DRAMs).

A circuit for implementing the digital filtering technique includes a pad for receiving a test mode enable input signal and means for receiving a binary filter signal, for example the row address strobe (RAS) signal. Logic circuitry asserts a first intermediate signal responsive to the test mode enable signal being asserted while the filter signal is in a predetermined logic state, for example a logic low. Additional logic asserts a second intermediate signal responsive to the filter signal switching states while the first intermediate signal is asserted.

Optionally, additional logic is provided for trapping the second intermediate signal until the filter signal again changes states, to provide an internal test mode enable signal that, once asserted, remains asserted for at least a minimum period determined by the filter signal.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

Figure 1:
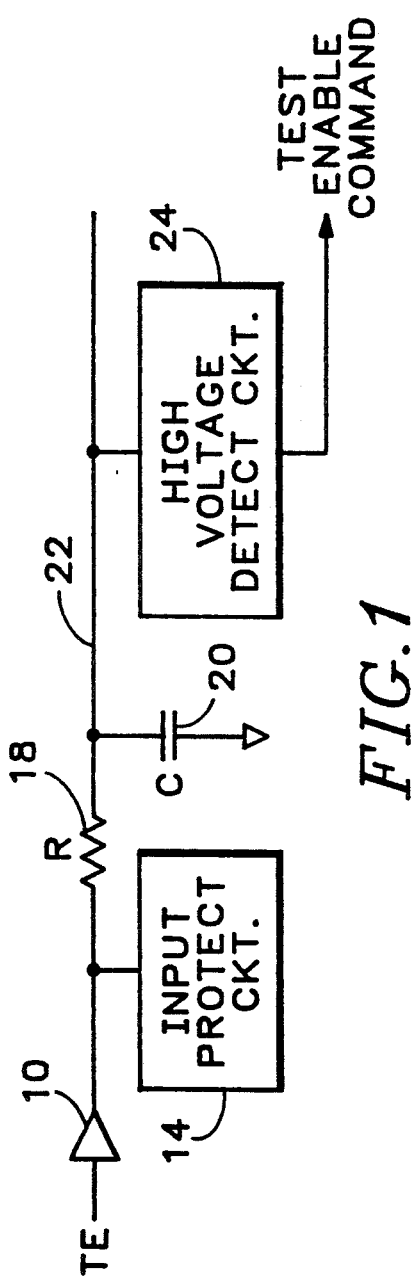
FIG. 1 is a schematic diagram of a test mode enable circuit including an RC low pass filter according to the present invention.

FIG. 1 is a schematic diagram of an analog filtered test mode enable circuit according to the present invention. A test enable pin TE 10 is coupled to an input protection circuit 14 as is known. Input TE is also coupled to a series resistor 18 followed by a shunt capacitor 20. Resistor 18 and capacitor 20 together form a low-pass filter. TE is active-high.

The filter output, node 22, is coupled to a test mode voltage detection circuit 24. The high voltage detection circuit may comprise, for example, a Schmitt trigger circuit. The threshold voltage may be adjusted, for example, by series diodes (not shown). The Schmitt trigger output provides the internal test mode enable signal. In operation, spikes and other noise on the TE pin are filtered out by the low-pass filter so that such noise does not switch the Schmitt trigger, thereby preventing inadvertent switching into test mode. In an operative example of an embodiment of the invention, resistor 18 is about 5K-ohms and capacitor 20 is about 6 picofarad. The time constant T=RC, therefore, is about 30 nanoseconds.

The analog filter technique described has the advantages of simplicity and reliable operation at all times. It is not affected, for example, by unknown logic states existing at initial power up of the IC.

Figure 2:
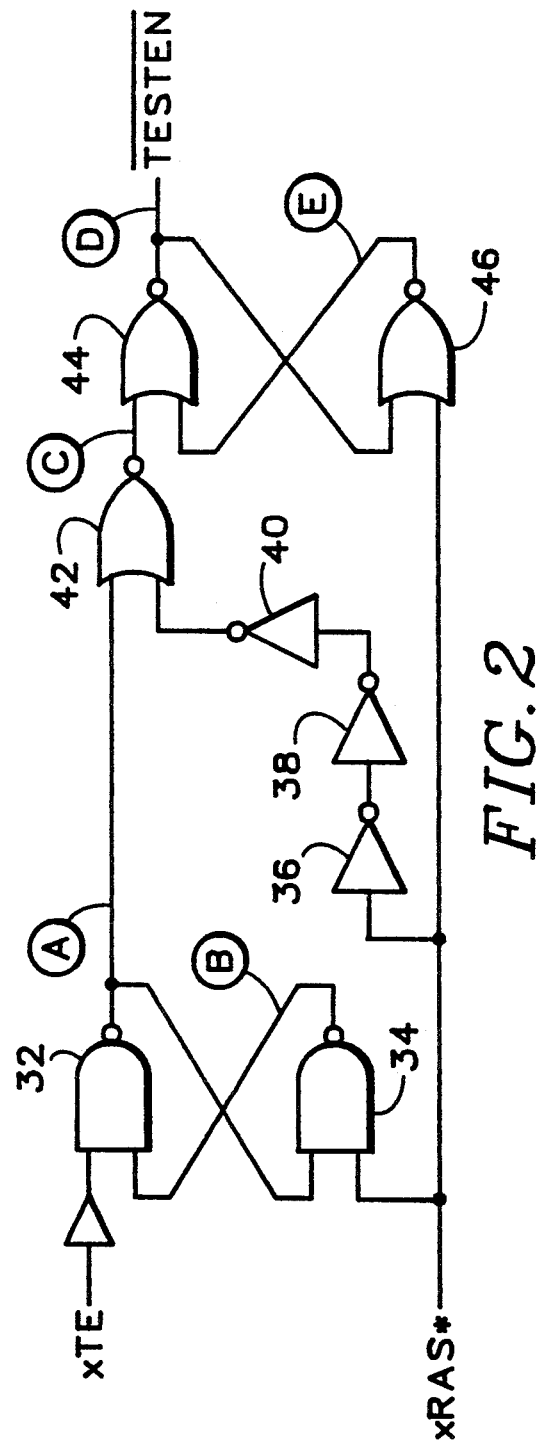
FIG. 2 is a schematic diagram of a test mode enable circuit including digital filtering according to the present invention.

Referring now to FIG. 2, an example of a digital filtered test mode enable circuit is shown. Hereinafter, an asterisk suffix will be used to indicate an active-low signal. Any of a wide variety of circuits may be used for this function. The essential function is to assert TESTEN* only after xTE has been asserted for at least one cycle of another binary signal, which we will call a filter signal, in order to filter out noise on the xTE line.

The filter signal is xRAS* in the example. Any convenient binary signal, such as a row address strobe or a clock signal, could be used as the filter signal. The only requirement is that the selected filter signal have a cycle time longer than any expected noise, spikes, switching transients or the like, so that such transients do not inadvertently switch the device into test mode.

The period of the filter signal determines the minimum period during which the test enable signal xTE must be asserted to switch the IC into test mode. While digital filtering requires more devices than analog filtering, it is more flexible in that the filter "time constant" can be changed simply by connecting the circuit to receive a filter signal having a different period. It also may require less chip area than the analog filter as it does not require a capacitor.

The foregoing functional description of the digital filtering technique will enable those skilled in the art to devise a convenient circuit to perform the function. A variety of latch, flip-flop or similar circuits may be used. FIG. 2 shows an example of a circuit that requires a minimum of devices and, therefore, a minimum of chip area.

Operation of the circuit of FIG. 2 is described next. The terms "low" and "high" will be used to refer to predetermined voltage levels corresponding logic zero (low) and logic one (high) signals, respectively. It is useful to refer also to FIG. 3, a timing diagram illustrating operation of the circuit of FIG. 2.

The circuit of FIG. 2 consists of three stages. In the first stage, NAND gates 32,34 are cross-coupled to form first and second input terminals and an output terminal. NAND gate 32 must have a high-voltage input terminal to withstand the increased test mode voltage at xTE, or the input signal may be buffered. The input terminals are coupled to the test enable pin xTE and the digital filter signal, here xRAS*, respectively.

The first stage output terminal provides an intermediate signal at node A. In operation, xTE high is recognized only when xRAS* is low. For example, referring to FIG. 3, a positive pulse #1 appearing on xTE while xRAS* is high does not change the state of any of the other logic signals (nodes A,B,C,D,E), so the pulse #1 effectively is ignored. Where xTE goes high while xRAS* is low, pulse #2 in FIG. 3, node A switches from its normal (high) to active (low) state.

Figure 3:
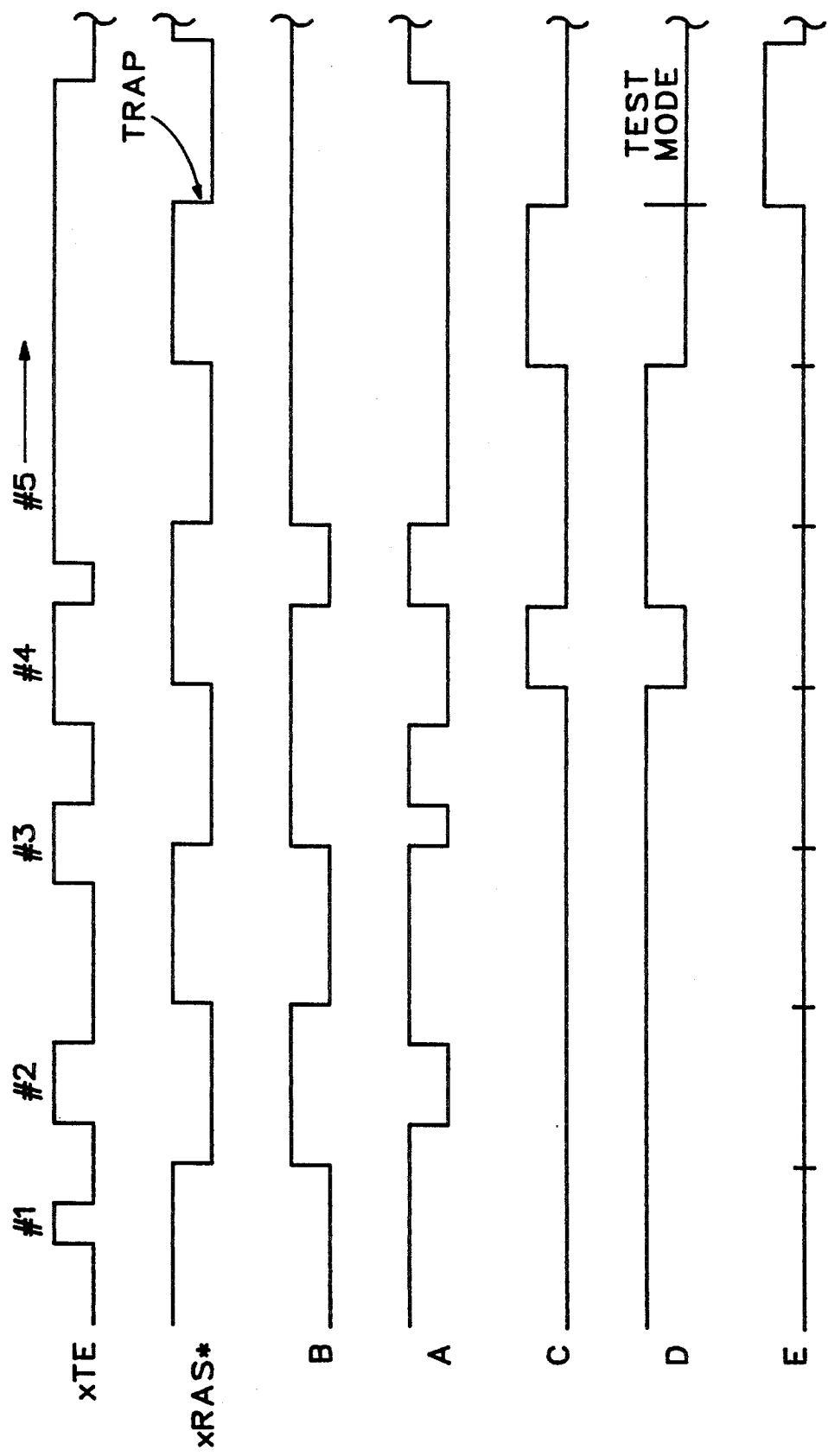
FIG. 3 is a timing diagram illustrating operation of the circuit of FIG. 2.

The second stage of the circuit of FIG. 2 includes NOR gate 42 and a series of inverters 36,38,40. xRAS* is coupled through the three inverters to a first input terminal of the NOR gate 42. The other input to NOR gate 42 is coupled to node A. The output of gate 42 provides a second intermediate signal at node C. In normal operating mode, node A is high and, therefore, node C is low. However, if A is low and xRAS* goes high, C goes high, as illustrated in FIG. 3 (see xTE pulse #4). In practice, however, the brief pulse at node C (and D) that results from xTE pulse #4 is ignored, because xRAS* is high at that time.

In summary, to switch into test mode, xTE first had to be high when xRAS* went low (to drive A low), and then had to remain high while xRAS* went high, to drive C high. Typically, in a commercial DRAM IC, xRAS* has a low period of about 80 nsec. That period is sufficient to filter out spikes on the xTE pin using the described circuit or its equivalent, thereby preventing inadvertent test mode switching.

The third stage of the circuit of FIG. 2 is optional. It ensures that the internal test enable signal (TESTEN*), once asserted, remains asserted for at least an entire xRAS* low period. The third stage comprises a pair of NOR gates 44,46 cross-coupled to form a latch. The latch has first and second input terminals coupled to node C and to xRAS*, respectively. The output terminal provides the TESTEN* signal.

Referring again to FIG. 3, see xTE pulse #5. This pulse was high during a complete xRAS* low period, at the end of which node C accordingly went high and, therefore, D went low. When xRAS* next goes low, E goes high, trapping D low. At this point, test mode is enabled. This state persists until xRAS* next goes high, driving E low and thereby releasing D. Once asserted, TESTEN* (node D) is held low at least until xRAS* goes high.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. In a random access memory integrated circuit (RAM IC), a test mode enable circuit comprising:
    first input means for receiving a test mode enable input signal;
    second input means for receiving a binary filter signal (xRAS*); and
    first logic means (32,34) coupled to the first and second input means for asserting a first intermediate signal (A) responsive to the test mode enable signal being asserted to an active logic state while the filter signal is in an active logic state.

2. A circuit according to claim 1 further comprising second logic means (36,38,40,42) coupled to receive the first intermediate signal (A) and the filter signal (xRAS*) for asserting a second intermediate signal (C) responsive to the filter signal switching states while the first intermediate signal is asserted.

3. A circuit according to claim 2 further comprising third logic means (44,46) coupled to receive the second intermediate signal (C) and the filter signal for trapping the second intermediate signal until the filter signal changes states, thereby providing an internal test mode enable signal (D) that, once asserted, remains asserted for at least a minimum period determined by the filter signal.

4. A circuit according to claim 3 wherein the third logic means comprises a pair of NOR logic gates cross-coupled so as to form a latch circuit.

5. A circuit according to claim 2 wherein the second logic means comprises:
 a NOR logic gate having first and second inputs, the first NOR gate input coupled to receive the first intermediate signal; and
 inverter means for inverting the binary filter signal to provide an inverted filter signal;
 the inverted filter signal being coupled to the second NOR gate input.

6. A circuit according to claim 1 wherein the first logic means comprises a cross-coupled pair of NAND logic gates.

7. In a random access memory integrated circuit (RAM IC), a method of filtering a test mode enable signal applied to the circuit, the method comprising:
 providing a digital filter signal;
 recognizing the test mode enable signal only when the filter signal is in a predetermined state and the test mode enable signal is asserted;
 asserting an internal test mode enable signal responsive to the filter signal changing state while the test mode enable signal is recognized; and,
 trapping the asserted internal test mode enable signal to ensure that, once asserted, the internal test mode enable signal has at least a predetermined minimum duration.

* * * * *